(12) United States Patent
Saiki et al.

(10) Patent No.: US 7,420,131 B2
(45) Date of Patent: Sep. 2, 2008

(54) WIRING SUBSTRATE

(75) Inventors: Hajime Saiki, Aichi (JP); Michitoshi Nakata, Tajimi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 257 days.

(21) Appl. No.: 10/787,406

(22) Filed: Feb. 27, 2004

(65) Prior Publication Data
US 2004/0177999 A1 Sep. 16, 2004

(30) Foreign Application Priority Data

| Feb. 28, 2003 | (JP) | ............................ P.2003-054201 |
| Feb. 28, 2003 | (JP) | ............................ P.2003-054572 |
| Jan. 30, 2004 | (JP) | ............................ P.2004-023494 |

(51) Int. Cl.
*H01R 12/04* (2006.01)
*H05K 1/11* (2006.01)

(52) U.S. Cl. .................. 174/266; 174/264; 361/792

(58) Field of Classification Search ......... 174/263–265, 174/262; 361/792–795
See application file for complete search history.

(56) References Cited

U.S. PATENT DOCUMENTS

| 4,963,697 | A |  | 10/1990 | Peterson et al. |
| 5,439,732 | A | * | 8/1995 | Nagasaka et al. ............ 428/210 |
| 5,951,917 | A | * | 9/1999 | Nayak et al. ................. 252/512 |
| 6,162,997 | A |  | 12/2000 | Memis |
| 6,281,446 | B1 | * | 8/2001 | Sakamoto et al. ........... 174/255 |
| 6,555,762 | B2 | * | 4/2003 | Appelt et al. ................ 174/264 |
| 6,573,458 | B1 |  | 6/2003 | Matsubara et al. |
| 6,810,583 | B2 | * | 11/2004 | Carpenter et al. ............. 29/852 |
| 6,909,054 | B2 | * | 6/2005 | Sakamoto et al. ........... 174/260 |
| 2002/0145197 | A1 | * | 10/2002 | Ohta et al. ................... 257/734 |
| 2002/0175402 | A1 | * | 11/2002 | McCormack et al. ....... 257/700 |

FOREIGN PATENT DOCUMENTS

| JP | 10-341080 | 12/1998 |
| JP | 2000-91383 | 3/2000 |
| JP | 2000-307220 | 11/2000 |
| JP | 2000-340951 | 12/2000 |
| JP | 2001345559 | 12/2001 |
| JP | 2002-290030 | 10/2002 |
| JP | 2003-8219 | 1/2003 |

\* cited by examiner

*Primary Examiner*—Jeremy C. Norris
(74) *Attorney, Agent, or Firm*—Sughrue Mion, PLLC (57) ABSTRACT

A wiring substrate, in which a wiring stacked portion including a conductor layer and a resin layer is stacked on a principal face of a core substrate including a substantially cylindrical through hole conductor in a through hole extending therethrough and a filling material filling a hollow portion of said through hole, comprising: a cover-shaped conductor portion covering an end face of said through hole just above a principal face of said core substrate and connected to said through hole conductor; and a terminal pad conductor provided over a principal face of said wiring stacked portion for disposing connection terminals used for connections with an external device, wherein a connection portion composed of via conductors buried in said resin layer brings said cover-shaped connection portion and said terminal pad conductor into conduction, and said via conductors composing said connection portion are provided not above a center axis of said through hole.

4 Claims, 8 Drawing Sheets

|  | EXAMPLE | COMPARISON |
|---|---|---|
| NO HEAT CYCLE | 0/30 | 8/17 |
| AFTER 100 CYCLES | 0/30 | 26/51 |
| AFTER 500 CYCLES | 0/30 | 10/18 |

WIRING SUBSTRATE

FIELD OF THE INVENTION

The present invention relates to a wiring substrate including a resin.

BACKGROUND OF THE INVENTION

The wiring resin substrate is provided on its principal face with a number of pad-shaped electrodes to be used for mounting electronic parts such as an LSI or an IC chip thereon and on its other principal face with a number of terminal pad conductors (or electrodes) to be connected with a mother board and connection terminals (e.g., solder balls) disposed on the terminal pad conductors. The wiring resin substrate of this type is small-sized and increased in the connection terminal number (e.g., the ball number) so as to enhance the integration and density of the electronic parts such as the LSI, the IC chip or a chip capacitor to be mounted thereon.

This wiring resin substrate is generally provided, in its internal structure, with: a core substrate having a through hole conductor and a filling material in a through hole formed in an insulating substrate; a terminal pad conductor formed on the end face of the through hole for disposing a cover-shaped conductor portion, a resin layer and a connection terminal (e.g., solder balls); and a via conductor buried in the resin layer for bringing the through hole conductor and the terminal pad conductor into conduction. As background arts, JP-A-2000-91383, JP-A-10-341080, JP-A-2000-307220 (Paragraphs [0014] and [0015]), JP-A-2000-340951 (Paragraphs [0014] and [0015]) are known.

SUMMARY OF THE INVENTION

The wiring resin substrate thus far described is troubled by the following problem in the procedure of a heat cycle to be performed for manufacturing it. In a core substrate acting as the nuclei of the wiring resin substrate, a through hole conductor is formed at a predetermined position of an insulating substrate made of a resin or the like so as to bring the two principal faces into conduction. Since a metal and a resin have different coefficients of thermal expansion, the expansion/shrinkage in the thickness direction of the core substrate due to the heat cycle is deviated depending on the position. In the layer stacked on the core substrate, therefore, the force to be applied by the expansion/shrinkage of the core substrate becomes heterogeneous. As a result, a cracking occurs in the joint face or the like of via conductors composing the connection portion, thereby to cause a problem that the electric connection from the through hole conductor to the terminal pad conductor is easily broken. This problem leads to the fact that the qualities such as the electric characteristics required of the wiring resin substrate are not kept.

In order to solve that problem, therefore, the present invention has an object to provide a wiring substrate made of a resin having highly reliable electric characteristics.

In order to solve the aforementioned problem, according to the invention, there is provided a wiring resin substrate, in which a wiring stacked portion including a conductor layer and a resin layer is stacked on the principal face of a core substrate having a substantially cylindrical through hole conductor in a through hole extending therethrough and a filling material filling the hollow portion of the through hole, comprising: a cover-shaped conductor portion covering the end face of the through hole just above the principal face of the core substrate and connected to the through hole conductor; and a terminal pad conductor formed above the principal face of the wiring stacked portion for disposing connection terminals used for connections with an external device, wherein a connection portion composed of via conductors buried in the resin layer brings the cover-shaped connection portion and the terminal pad conductor in conduction, and wherein the via conductors composing the connection portion avoid the positions above the center axis of the through hole.

Herein, the "center axis (or center axial line)" is oriented in the same direction as that for the through hole to extend through (i.e., the thickness direction of the core substrate) and passes the center position of the substantially circular projected image, which is formed by projecting the through hole, the via conductor and the terminal pad conductor individually on a plane normal to that through direction.

Figure 3A:
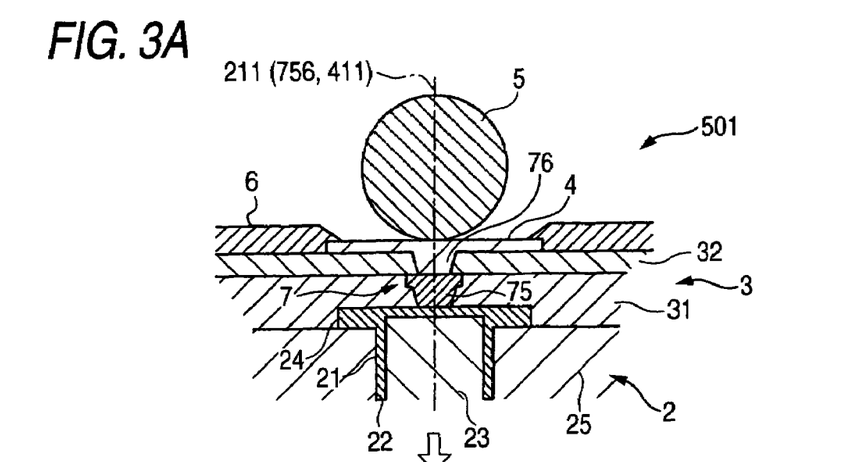
FIGS. 3A to 3C are schematic diagrams showing the influences to be exerted by the expansion/shrinkage of the core substrate.
Figure 3B:
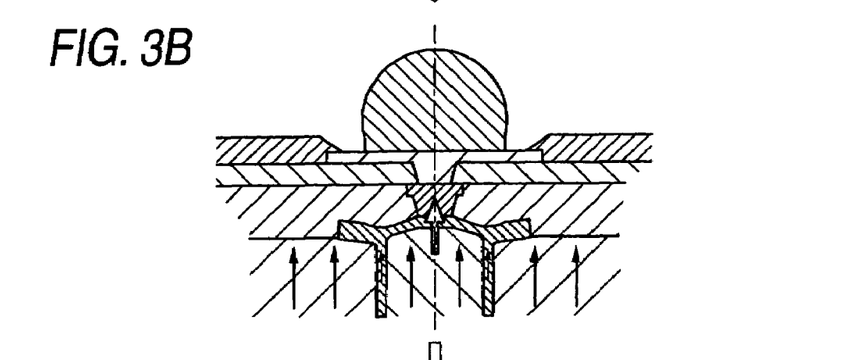
Figure 3C:
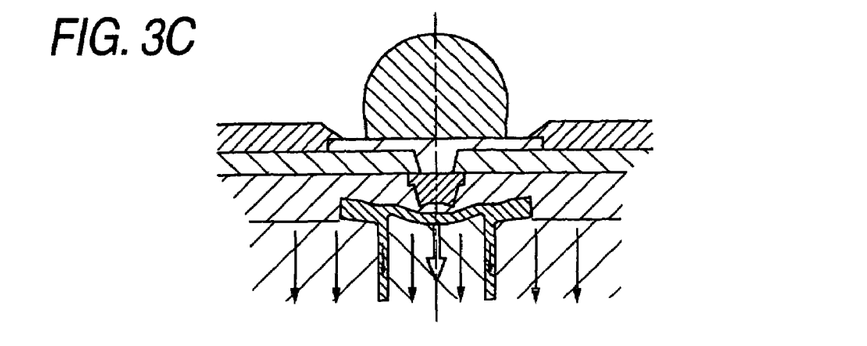

Generally, a resin material has a larger coefficient of thermal expansion than that of a metallic material. In case a wiring resin substrate 501 (as shown in FIG. 3A) is heated, a substantially cylindrical through hole conductor 22 (of a metallic material), a filling material 23 (of a resin material) filling the hollow portion of the through hole conductors 22, and an insulating substrate material 25 (of a resin material having a through hole 21, as located around the through hole conductor 22), all of which construct a core substrate 2, expand individually in the thickness direction. As shown in FIG. 3B, the expansion of the through hole conductor 22 is smaller than those of the surrounding resin materials 23 and 25. A cover-shaped conductor portion 24 connected to the through hole conductor 22 can hold the vicinity of the peripheral edge of the end face of the filling material 23 so that the expansion of the filling material 23 is obstructed. As a result, the expansion of the filling material 23 is concentrated in the vicinity of the center axis 211 of the through hole 21 to push up the cover-shaped conductor portion 24 and a resin layer 3 lying over the filling material 23. In case the wiring resin substrate 501 is cooled, on the other hand, a reverse phenomenon occurs so that the shrinkage of the filling material 23 is concentrated in the vicinity of the center axis 211 of the through hole 21, as shown in FIG. 3C, to pull down the overlying cover-shaped conductor portion 24 and resin layer 3. If the center axis 756 of via conductors 75 and 76 and the center axis 411 of a terminal pad conductor 4 are at the position of the center axis 211 of the through hole 21, therefore, they are easily influenced by the push-up/pull-down from the core substrate 2. An excessive stress concentration occurs between the cover-shaped conductor portion 24 and the via conductor 75, between the via conductors (i.e., the via conductors 75 and 76) and between the via conductor 76 and the terminal pad conductor 4 so that they are liable to be electrically disconnected (FIG. 3C shows the case, in which the connection between the cover-shaped conductor portion 24 and the via conductor 75 is broken. Here, the wiring substrate of the related art has been unable to avoid that problem because the via conductors are arranged above the center axis of the through hole so as to make the wiring highly dense.

As in the invention thus far described, therefore, the influences of the aforementioned push-up/pull-down from the core substrate can be hardly received by arranging the via conductors constructing the connection portion at the positions avoiding that above the center axis of the through hole. It is more preferable that the via conductors composing the connection portion avoid the positions above the filling material in the through hole conductor. Here, this mode having the via conductor displaced from the center axis of the through hole will be called the "first construction mode" in the wiring resin substrate of the invention.

Next in the wiring resin substrate of the invention, of the via conductors composing the connection portion, the via conductors to be connected with the cover-shaped conductor portion can be conformal vias. As the via conductors, there are two kinds of: the filled vias which are filled up with a metallic material in the holes opened in the resin layer for forming themselves; and the conformal vias which are formed by arranging a metallic material along the hole wall and by burying the remaining portion with a resin material. Since the resin material has a smaller coefficient of thermal expansion than that of the metallic material, as described above, the conformal via is liable to produce a repulsive force caused by the expansion of the resin material on the inner side, when an external force to be generated according to the expansion/shrinkage of the core substrate or the resin layer is applied. Therefore, the conformal via is less influenced by the external force than the filled via made wholly of the metallic material. By composing the via conductor to be connected to the cover-shaped conductor portion formed just above the principal face of the core substrate, of the conformal via, therefore, it is possible to hardly receive the aforementioned push-up/pull-down from the from the core substrate. Here, this mode, in which the via conductor to be connected with the cover-shaped conductor portion is composed of the conformal vias, will be called the "second construction mode" in the wiring resin substrate of the invention.

Next, in the wiring resin substrate of the invention, of the via conductors composing the connection portion, the via conductors to be connected with the terminal pad conductor can avoid the positions above the through hole. Thus, the connection portion between the via conductors and the terminal pad conductor is not positioned above the through hole so that the electric connection between the via conductors and the terminal pad conductor can be more reliably retained.

Next in the wiring resin substrate of the invention, of the via conductors composing the connection portion, the via conductors on the side of the terminal pad conductor can be more spaced above the through hole from the center axis of the through hole than the via conductors on the side of the cover-shaped conductor portion. If the via conductors are arranged concentrically (with their center axes being substantially aligned) above the through hole, the joint face between the via conductors may be easily cracked by the push-up/pull-down of the core substrate. Above the through hole, therefore, the via conductors are not concentrically arranged but formed upward (i.e., toward the terminal pads) away from the center axis of the through hole so that they can hardly receive the influences of the aforementioned push-up/pull-down from the core substrate.

Alternatively, in the wiring resin substrate of the invention, the connection portion has a stacked via structure, in which a plurality of filled vias (the via conductors) can be substantially concentrically contiguous to each other at positions other than that above the through hole. Thus, the connection portion can be constructed at positions avoiding that above the through hole, which is seriously influenced by the push-up/pull-down of the core substrate. If the connection portion constructs the stacked vias in this case, it is possible to spare the space in the wiring stacked portion thereby to retain the wiring area.

Next, in the wiring resin substrate of the invention, the through hole can be out of position below the center axis of the terminal pad conductor. Not only the connection portion composed of the aforementioned via conductors but also the terminal pad conductor itself may be influenced by the push-up/pull-down from the core substrate. In this case, the connection reliability between the terminal pad conductor and the connection portion maybe lost. In addition, the connection with the external device may be troubled the dispersion in the formed height of the connection terminal to be disposed at the connection terminal pad. It is, therefore, preferable that the influences of the push-up/pull-down from the core substrate is hardly received by positioning the through hole not under the center axis of the terminal pad conductor.

The first construction mode in the wiring resin substrate of the invention will be described more specifically. Here in the invention, the connection terminal with the external device can be a wiring substrate of the BGA (Ball Grid Array) type made of solder balls. The following description is made by using the wiring substrate of the BGA type.

Specifically, according to the invention, there is provided a wiring resin substrate with balls, comprising: a core substrate including a through hole formed through an insulating substrate, a substantially cylindrical through hole conductors formed on the inner circumference of the through hole, and a filling material filling the hollow portion of the through hole conductors; a cover-shaped conductor layer formed on at least one principal face of the core substrate and in a shape containing the end face of the through hole and having conduction to the through hole conductor; a plurality of resin layers formed over the cover-shaped conductor layer; a ball pad conductor formed over the resin layers and having solder balls to be connected with the connection terminals of an external device; and a connection portion having via conductors buried individually in the resin layers for bringing the cover-shaped conductor layer and the ball pad conductor into conduction, wherein the via conductors are made of filled vias, and wherein in case the through direction of the through hole is the center axis direction, the individual center axes of the via conductors composing the connection portion and the ball pad conductor are not aligned with the center axis of the through hole.

Thus, the center axes of the individual via conductors composing the connection portion and the ball pad conductor in the same direction as the through direction of the through hole are arranged to avoid the center axis in the through direction of the through hole, so that the aforementioned influences of the push-up/pull-down from the core substrate can be hardly received.

Next, in the wiring resin substrate with balls of the invention, it is preferred that the center axis of the ball pad conductor is not positioned above the through hole. The diameter of the ball pad conductor is set (at about 150 μm, for example) in dependence upon the diameter of the solder balls to be connected with the external device so that it is made larger by about four times than that (e.g., about 150 μm) of the through hole in the highly integrated wiring substrate. Even if the center axis of the ball pads is offset from the center axis of the through hole, it is supposed to fail to avoid the influences of the push-up/pull-down from the core substrate sufficiently, so long as it is located above the through hole. By arranging the ball pad conductor, as described above, it is possible to hardly receive those influences.

Next, in the via conductors composing the connection portion, it is preferred that the center axis of the via conductors positioned over the via conductors positioned above the through hole are more spaced from the center axis of the through hole than that of the via conductors positioned over the through hole. If the via conductors are concentrically (with the center axes being aligned) arranged and connected above the through hole, it is supposed that the joint face between the via conductors is easily cracked by the push-up/pull-down of the core substrate. Therefore, the via conductors are not concentrically arranged above the through hole but spaced the more for the upper ones from the center axis of the through hole, where the influences of the expansion/shrinkage of the core substrate are serious.

Next, in the wiring resin substrate with balls of the invention, it is preferred that at least those of the via conductors composing the connection portion, which are to be connected with the ball pad conductor, are not positioned above the through hole. With this construction, the connection portion between the via conductors and the ball pad conductor can avoid the positions above the through hole thereby to make the electric connection more reliable between the via conductors and the ball pad conductor 4 (and the solder balls to be disposed thereon).

Next, in the wiring resin substrate with balls of the invention, it is preferred that the via conductors composing the connection portion do not exist above the through hole. The aforementioned push-up/pull-down of the core substrate exerts more serious influences on the upper portion of the through hole than on the upper portion of the substrate material of the core substrate. In case the via conductors are above the through hole, therefore, it is supposed that those influences cannot be sufficiently avoided. Thus, these influences can be hardly received by making the aforementioned construction, in which the via conductors are not positioned above the through hole.

Next, in the wiring resin substrate with balls of the invention, it is preferred that the connection portion is positioned not above the through hole and that the via conductors are made of the substantially concentrically contiguous stacked vias. With the via conductors thus composing the stacked via, in addition to the aforementioned effects, the space in the resin layers can be spared to retain the wiring area. Here, the position to dispose the stacked via is not above the through hole for the aforementioned reasons.

The second construction mode in the wiring resin substrate of the invention will be described more specifically. Here in the invention, the connection terminal with the external device can be a wiring substrate of the BGA (Ball Grid Array) type made of solder balls. The following description is made by using the wiring substrate of the BGA type.

Specifically, according to the invention, there is provided a wiring resin substrate comprising: a core substrate including a through hole formed through an insulating substrate, a substantially cylindrical through hole conductors formed on the inner circumference of the through hole, and a filling material filling the hollow portion of the through hole conductors; a cover-shaped conductor layer formed on at least one principal face of the core substrate and in a shape containing the end face of the through hole and having conduction to the through hole conductor; a plurality of resin layers formed over the cover-shaped conductor layer; a ball pad conductor formed over the resin layers and having solder balls to be connected with the connection terminals of an external device; and a connection portion having via conductors buried individually in the resin layers for bringing the cover-shaped conductor layer and the ball pad conductor into conduction, wherein the via conductor of the connection portion, which is connected to the cover-shaped conductor layer, is composed of conformal vias whereas the remaining via conductors are composed of filled vias, and wherein in case the through direction of the through hole is the center axis direction, the individual center axes of the via conductor composed of the filled vias and the ball pad conductor are not aligned with the center axis of the through hole.

As the via conductors, there are two kinds of: the filled vias which are filled up with a metallic material in the holes opened in the resin layer for forming themselves, and the conformal vias which are formed by arranging a metallic material along the hole wall and by burying the remaining portion with a resin material. Since the resin material has a smaller coefficient of thermal expansion than that of the metallic material, an described above, the conformal via is liable to produce a repulsive force caused by the expansion of the resin material on the inner side, when an external force to be generated according to the expansion/shrinkage of the core substrate or the resin layer is applied. Therefore, the conformal via is less influenced by the external force than the filled via made wholly of the metallic material. By composing the via conductor to be connected to the cover-shaped conductor portion formed just above the principal face of the core substrate, of the conformal via, therefore, it is possible to hardly receive the aforementioned push-up/pull-down from the from the core substrate.

In the connection portion, moreover, the via conductors other than those to be connected with the cover-shaped conductor portion, especially the via conductors to be connected with the ball pad conductor are constructed of the filled vias so that the reliability of the electric connection can be retained between the via conductors and the ball pad conductors (and the solder balls to be disposed thereon). Since the filled vias are more easily subjected to the influences of the external force than the conformal vias, the individual filled vias are arranged not to have their center axes positioned above the center axis of the through hole, on which the influences of the push-up/pull-down from the core substrate are serious.

Moreover, the ball pad conductor is also enabled to hardly receive the influences of the push-up/pull-down from the core substrate by arranging its center axis not in alignment with the center axis of the through hole.

Herein, the "center axis" is oriented in the same direction as that for the through hole to extend through and passes the center position of the substantially circular projected image, which is formed by projecting the through hole, the via conductor and the ball pad conductor individually on a plane normal to that through direction.

Next, in the wiring resin substrate with balls of the invention, it is preferred that the center axis of the ball pad conductor is not positioned above the through hole. The diameter of the ball pad conductor is set (at about 150 µm, for example) in dependence upon the diameter of the solder balls to be connected with the external device so that it is made larger by about four times than that (e.g., about 150 µm) of the through hole in the highly integrated wiring substrate. Even if the center axis of the ball pads is offset from the center axis of the through hole, it is supposed to fail to avoid the influences of the push-up/pull-down from the core substrate sufficiently, so long as it is located above the through hole. By arranging the ball pad conductor, as described above, it is possible to hardly receive those influences.

Next, in the via conductors composing the connection portion, it is preferred that at least those of the via conductors composing the connection portion, which are to be connected with the ball pad conductor, are not positioned above the through hole. With this construction, the connection portion between the via conductors and the ball pad conductor can avoid the positions above the through hole thereby to make the electric connection more reliable between the via conductors and the ball pad conductor (and the solder balls to be disposed thereon).

Next, in the wiring resin substrate with balls of the invention, it is preferred that the via conductors composed of the filled vias do not exist above the through hole. In case the via conductors composed of the filled vias are above the through hole, it is supposed that the influences of the push-up/pull-down from the core substrate cannot be sufficiently avoided. Thus, these influences can be more hardly received by arranging the via conductors composed of the filled vias not above the through hole.

In the wiring resin substrate of the invention, the diameter of the through hole can be set to 100 μm or more and 300 μm or less. In case the diameter of the through hole is excessively large, an excessive stress concentration due to the pull-down occurs more easily on the through hole conductor having a smaller coefficient of thermal expansion than in the vicinity of the center axis of the through hole. Therefore, it may be disadvantages to the contrary that the center axes of the via conductors and the terminal pad conductor (e.g., the ball pad conductor) are not aligned with the center axis of the through hole. Moreover, this misalignment is also supposed to become disadvantageous for the high integration and high density of the wiring substrate. In order to avoid these influences, it is preferred that the through hole has a diameter of 300 μm or less. Moreover, the through hole diameter has no specified lower limit but can be set to 100 μm at this stage in accordance with the current integration of the wiring substrate. Still moreover, it is more preferred that the through hole has a diameter of 150 μm or more and 300 μm or less.

In case the through hole diameter is within the above-specified range, moreover, the average wall thickness of the substantially cylindrical through hole conductor can be 10 μm or more and 30 μm or less. If the average wall thickness is excessively large, the expansion of the filling material in the through hole conductor may be concentrated in the vicinity of the center axis of the through hole. The, the excessive stress concentration may be easily caused by the push-up, and a disadvantage is invited in the cost. Therefore, it is preferred that the upper limit is set at 30 μm. Although not limitative, the lower limit can be set to 10 μm because it is supposed that the excessively small thickness may fail to effect the conduction. It is more preferred that the average wall thickness of the substantially cylindrical through hole conductor is 15 μm or more and 25 μm or less.

In case the through hole or the through hole conductor is within the above-specified range, moreover, the individual center axes of the via conductors can be spaced at a distance of 50 μm or more and 150 μm or less from the center axis of the through hole. If the distance from the center axis of the via conductors to the center axis of the through hole is shorter than 50 μm, it is supposed that the center axis of the via conductors come excessively close to the position of the center axis of the through hole, at which the influences of the push-up/pull-down from the core substrate are serious, so that it is easily influenced. If the distance is longer than 150 μm, on the other hand, it is supposed to invite disadvantages in the high integration and high density of the wiring substrate. It is more preferred that the distance from the individual center axes of the via conductors to the center axis of the through hole is 50 μm or more and 130 μm or less.

In case the connection portion is constructed of the stacked vias, on the other hand, the center axis of the stacked vias is set at a distance of 50 μm or more and 150 μm or less from the outer edge end of the through hole. Since the stacked vias are susceptible to the influences of the push-up/pull-down of the core substrate, as described above, it is necessary for little reception of those influences that the distance from the outer edge end of the through hole to the center axis of the stacked vias be 50 μm or more. In excess of 150 μm, on the other hand, it is supposed that the disadvantages are invited in the high integration and density of the wiring substrate. Moreover, it is more preferred that the distance from the outer edge end of the through hole to the center axis of the stacked vias be 50 μm or more and 130 μm or less.

DESCRIPTION OF REFERENCE NUMERALS AND SIGNS

1, 101, 201, 501 WIRING RESIN SUBSTRATE
2 CORE SUBSTRATE
21 THROUGH HOLE
22 THROUGH HOLE CONDUCTOR
23 FILLING MATERIAL
24 COVER-SHAPED CONDUCTOR LAYER
3 RESIN LAYER
4 TERMINAL PAD CONDUCTOR (BALL PAD CONDUCTOR)
5 SOLDER BALL
6 SOLDER RESIST LAYER
7 CONNECTION PORTION

DETAILED DESCRIPTION OF THE INVENTION

Figure 1:
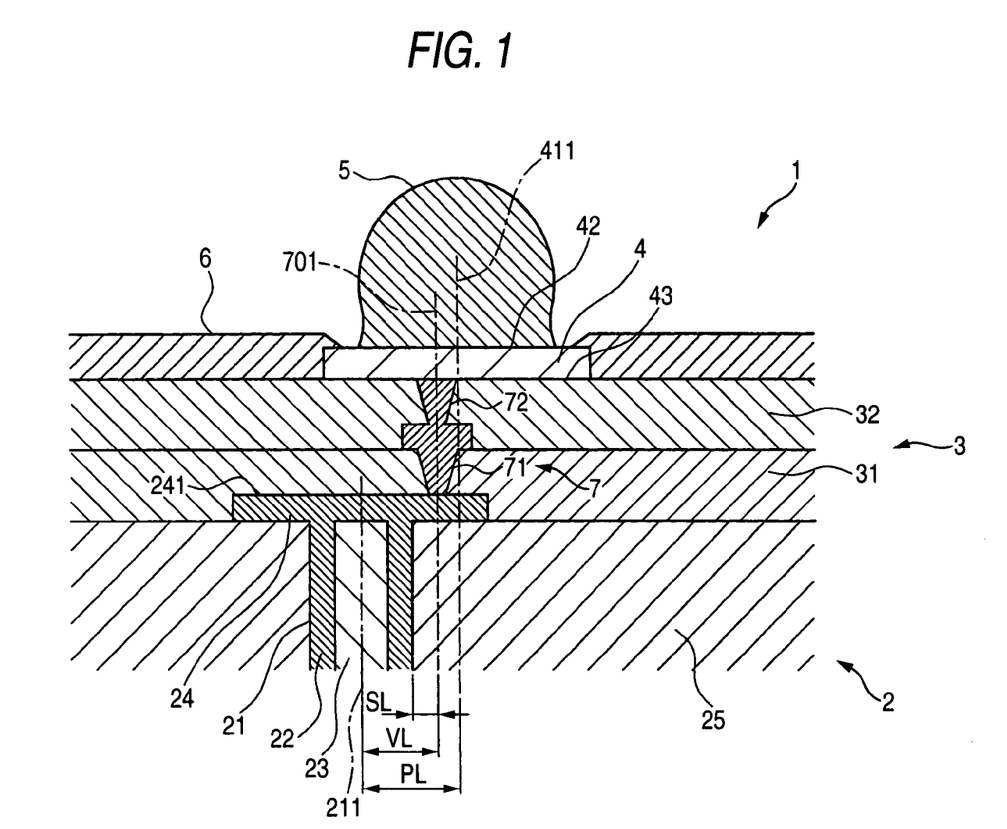
FIG. 1 is a schematic diagram illustrating the internal structure of a wiring resin substrate (of a first construction mode) according to the invention.
Figure 2:
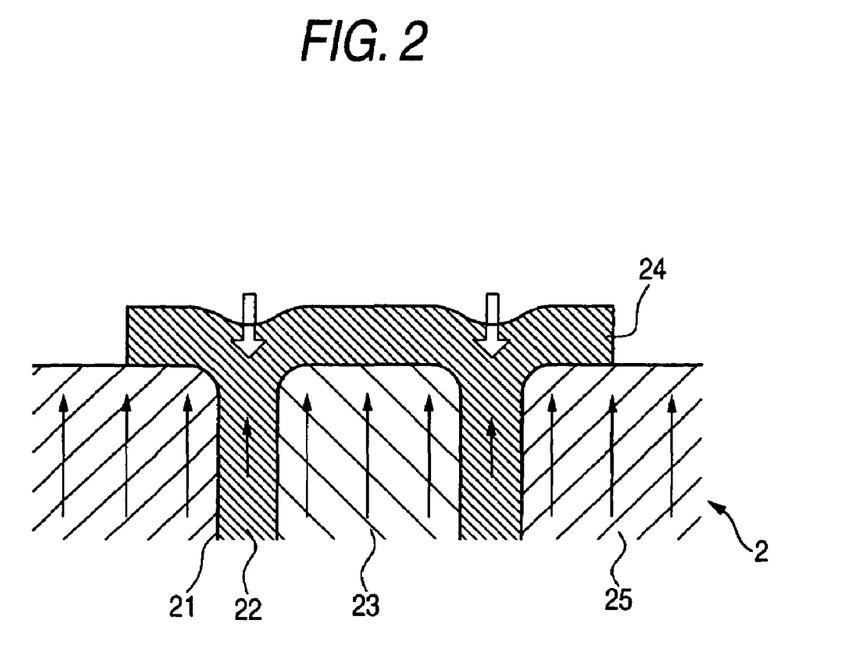
FIG. 2 illustrates the expansion/shrinkage of a core substrate in case a through hole diameter is large.

An embodiment of a wiring substrate made of a resin of the invention will be described with reference to the accompanying drawings. Here, the following description is made on the wiring resin substrate with balls, but the shape of the connection terminals should not be limited thereto. FIG. 1 is a sectional view of a wiring resin substrate 1 with balls according to a first construction mode of the invention. This wiring resin substrate 1 with balls is formed into a rectangular shape (having a length and a breadth of 50 mm and a thickness of 1 mm) in a top plan view. FIG. 1 is an enlarged view of a portion of the internal structure on the side of the principal face, which has a number of solder balls 5 to be connected with the connection terminals of an external device such as a mother board. On the other principal face side, although not shown, there are formed a number of electrodes for connecting a semiconductor integrated circuit element IC to be mounted. In the internal structure, there are also formed internal wiring layers and via conductors for connecting the individual internal wiring layers.

The core substrate 2 is provided with: through holes 21 of a diameter of about 150 μm (preferably, 100 μm to 350 μm), which are formed at an interval of about 500 μm (preferably, 200 μm to 800 μm) through a substrate material 25 made of a resin material composed mainly of a BT resin and having a thickness of about 0.8 mm (preferably, 0.3 mm to 1.2 mm); through hole conductors 22 made of a metallic material composed mainly of copper and formed on the inner circumferences of the through holes 21 and in a substantially cylindrical shape (having a thickness of about 20 μm, preferably 10 μm to 50 μm); and a filling material 23 filling the hollow portions of the through hole conductors 22 and made of a resin material composed mainly of an epoxy resin, an epoxy acrylate resin, an acrylic resin or a polyimide resin. On the surface of the core substrate 2, there is formed a cover-shaped conductor portion 24, which has a shape containing the end face of the through hole 21 and which is connected with the through hole conductor 22. The cover-shaped conductor portion 24 is formed into a cylindrical shape having a diameter of about 250 μm (preferably, 200 μm to 450 μm) and a thickness of about 30 μm (preferably, 15 μm to 150 μm), and is arranged to have its center axis aligned with the center axis 211 in the through direction of the through hole. Moreover, the cover-shaped conductor portion 24 has a larger diameter than that of the through hole so that it covers the substrate material 25 over about 100 μm (preferably, 50 μm to 150 μm) from the outer edge end of the through hole 21.

Figure 10:
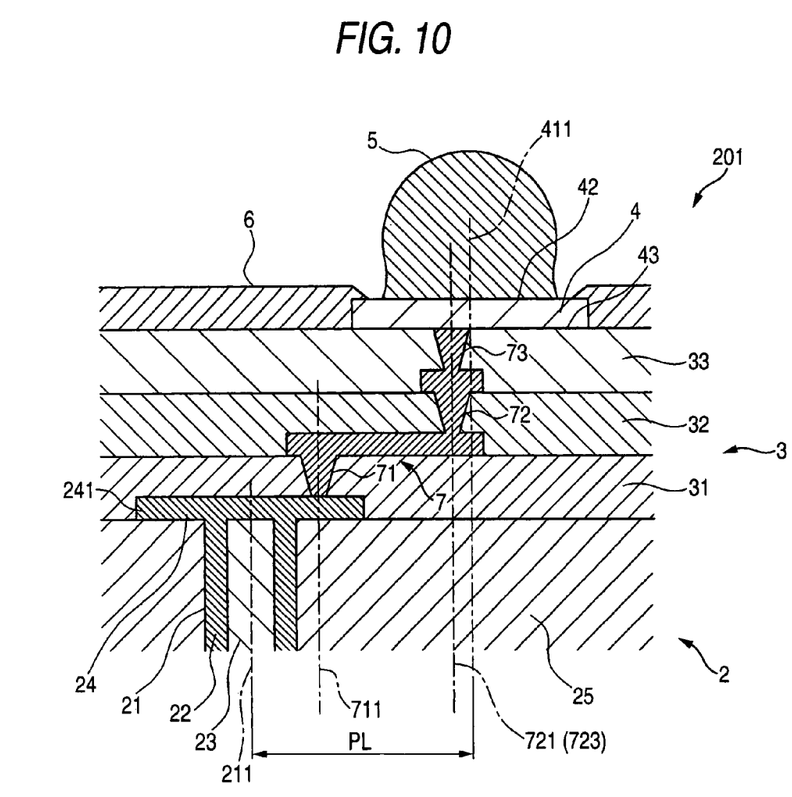
FIG. 10 is a schematic diagram illustrating a wiring resin substrate having three resin layers.

Over the core substrate 2 thus constructed, there are formed a plurality of resin layers 3, which are composed mainly of an epoxy resin, a fluorine-containing resin or a BCB (Benzo Cyclo Butene), which have two layers of a lower side resin layer 31 and an upper side resin layer 32 and which have a thickness of about 60 μm, preferably 30 μm to 300 μm (i.e., a thickness of about 30 μm for each layer, preferably 15 μm to 150 μm). In this construction mode, the resin layers are composed of and should not be limited to the two layers, but may be three or more layers. Over the upper side resin layer 32, moreover, there are formed a number of conductor layers, which are composed mainly of cylindrical copper and which are arranged at a spacing of about 1.3 mm (preferably, 0.5 mm to 5 mm). These conductor layers are plated on their surfaces with nickel or gold to form ball pad conductors (or terminal pad conductors) 4. These ball pad conductors 4 are sized to have a diameter of about 700 μm (preferably, 500 μm to 1,000 μm) and a thickness of about 15 μm (preferably, 5 μm to 50 μm). The ball pad conductors 4 are disposed at such positions that they can be connected with an upper side filled vias 72 of the later-described connection portion 7 and that a distance PL from the center axis 411 of the ball pad conductors 4 to the center axis 211 of the through hole 21 is set to about 425 μm (preferably, 300 μm to 600 μm), for example. Moreover, the resin layers 3 can be three or more, as shown in a wiring resin substrate 201 of FIG. 10.

Here, the upper side resin layer 32 is covered, at the portions not having the ball pad conductors 4 arranged, with a solder resist layer 6 having a thickness of about 20 μm (preferably, 5 μm to 50 μm). In this construction mode, this solder resist layer 6 is formed to cover the peripheral edge of the upper side principal face 42 of the ball pad conductor 4 over a predetermined width but to expose the central portion of the upper side principal face 42 of the ball pad conductor 4 concentrically to the outside. In this construction mode, the diameter of the exposed portion (namely, the opening of the solder resist layer 6, i.e., that portion of the upper side principal face 42 of the ball pad conductor 4 which is not covered with the solder resist layer 6), that is, the diameter of the soldered face of the upper side principal face 42 of the ball pad conductor 4 is set to about 530 μm (preferably, 300 μm to 800 μm).

The solder balls 5 are disposed substantially concentrically over the upper side principal face 42 of the ball pad conductor 4. At this time, the spherical solder ball 5 is molten to wet and extend toward the upper side principal face 42 of the ball pad conductor 4. Moreover, the amount of the solder is suitably selected depending on the diameter of the ball pad conductor 4. It is desired that the solder ball 5 after formed has a height of about 600 μm (preferably, 400 μm to 800 μm) from the upper side principal face 42 of the ball pad conductor 4, and that the wetting extension of the solder ball 5 does not exceed the peripheral edge end of the upper side principal face 42 of the ball pad conductor 4. Here, the used solder is a well-known one (e.g., Pb 82%/Sn 10%/Sb 8%, or Sn 95%/Sb 5%).

In the wiring resin substrate 1 according to the first construction mode, as shown in FIG. 1, the filled vias (71 on the lower side and 72 on the upper side) are buried in the lower side resin layer 31 and the upper side resin layer 32 of the resin layers 3. These filled vias 71 and 72 are formed by filling the via hole, which is formed through the resin layers, with a metallic material composed mainly of copper. The filled vias 71 and 72 are formed to have the maximum diameter of about 75 μm (preferably, 50 μm to 100 μm).

The filled vias 71 and 72 are substantially concentrically connected to form the connection portion (or the stacked via) 7. Moreover, the lower side filled via 71 is connected to an upper side principal face 241 of the underlying cover-shaped conductor portion 24, and the upper side filled via 72 is connected to a lower side principal face 43 of the overlying ball pad conductor 4, thereby to bring the cover-shaped conductor portion 24 and the ball pad conductor 4 into conduction. On the other hand, the stacked via 7 is arranged to have its center axis 701 arranged such that a distance VL from the center axis 211 of the through hole 21 is about 75 μm (preferably, 50 μm to 300 μm) and such that a distance SL from the outer edge end of the through hole 21 is about 10 μm (preferably, 5 μm to 50 μm), thereby to hardly receive the influences of the expansion/shrinkage of the core substrate 2.

Figure 5:
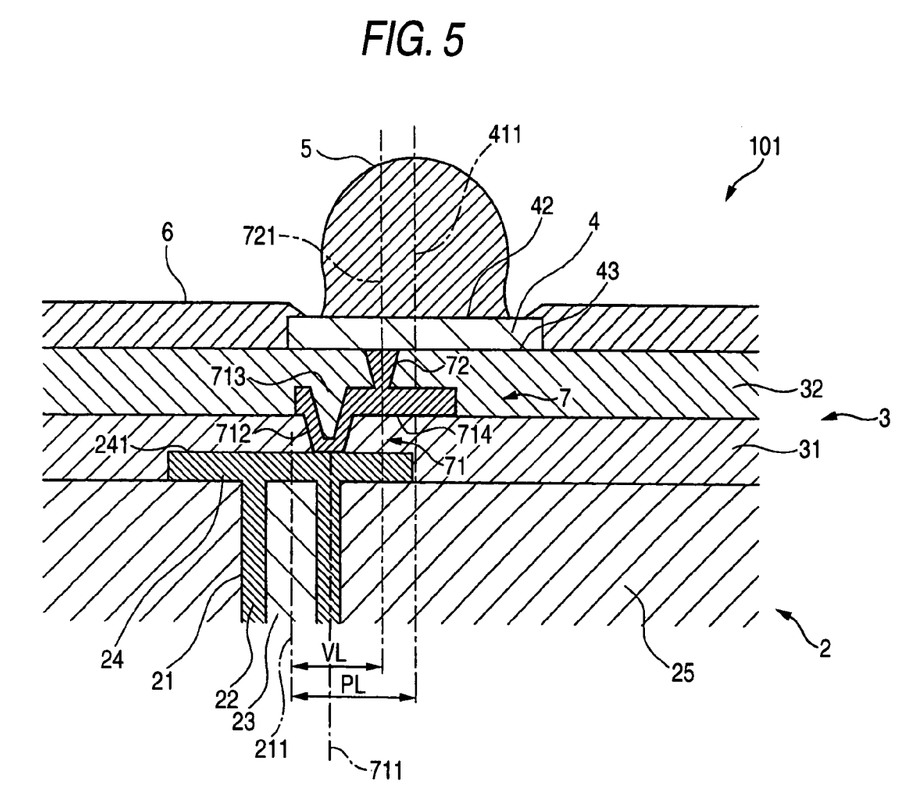
FIG. 5 is a schematic diagram illustrating the internal structure of a wiring resin substrate (of a second construction mode) according to the invention.

Here will be described a wiring resin substrate 101 with balls according to a second construction mode. FIG. 5 is a sectional view of the wiring resin substrate 101 with balls according to the second construction mode. The following description is made mainly on those different from the first construction mode, and is simplified on the common portions by designating them by the common reference numerals in FIG. 5.

In the wiring resin substrate 101 with balls according to the second construction mode, as shown in FIG. 5, in the resin layers 3, the conformal via 71 is buried in the lower side resin layer 31, and the filled via 72 is buried in the upper side resin layer 32. The conformal via 72 is composed of: a metallic material 712 composed mainly of copper and arranged along the wall of a via hole formed through the resin layer; a resin material 713 made of the same component as that of the resin layer 3 burying the remaining portion; and a connection layer 714 extending toward and connected to the filled via 72. On the other hand, the filled via 72 is formed by filling the via hole formed through the resin layer, with a metallic material composed mainly of copper. The conformal via 71 and the filled via 72 are formed to have the maximum diameter of about 75 μm (preferably, 50 μm to 100 μm), for example. However, the diameter of the conformal via 71 is regulated by the portion (i.e., the inside of the via hole) not containing the connection layer 714.

The conformal via 71 and the filled via 72 are connected to form the connection portion 7. Moreover, the conformal via 71 is connected to the upper side principal face 241 of the underlying cover-shaped conductor portion 24, and the filled via 72 is connected to the lower side principal face 43 of the overlying ball pad conductor 4, thereby to bring the cover-shaped conductor portion 24 and the ball pad conductor 4 into conduction. On the other hand, the filled via 72 is arranged such that its center axis 721 is spaced by the distance VL of about 125 μm (preferably, 50 μm to 300 μm) from the center axis 211 of the through hole 21 so that it may hardly receive the influences of the expansion/shrinkage of the core substrate 2. Here in this construction mode, the center axis 711 (regulated by the portion not containing the connection layer 714) of the conformal via 71 is not aligned with the center axis 211 of the through hole 21. However, the disposed position of the conformal via 71 is not especially limited so long as the conformal via 71 can be connected to the upper side principal face 241 of the cover-shaped conductor portion 24.

Figure 7:
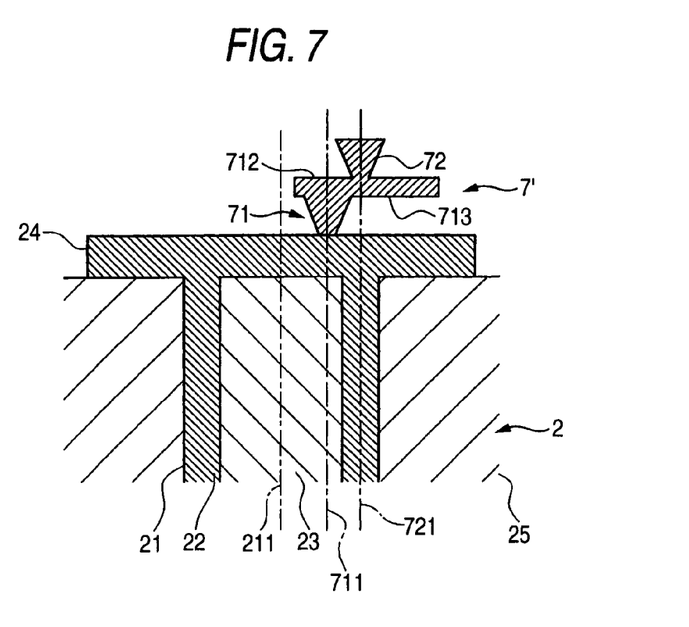
FIG. 7 is a schematic diagram illustrating another construction mode ② of the wiring resin substrate of the invention.
Figure 8:
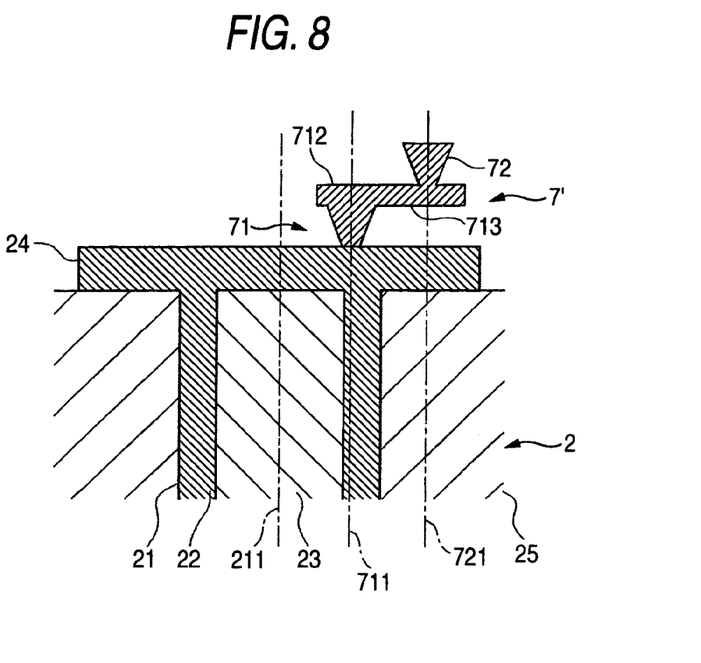
FIG. 8 is a schematic diagram illustrating another construction mode ③ of the wiring resin substrate of the invention.

Another construction mode of the wiring resin substrate of the invention will be described with reference to FIGS. 6 to 8. Here, these Figures present the wiring resin substrate with balls, which include the two resin layers, and omit the remaining components so as to clarify the positional relation between the connection portion (as designated by 7' because it contains components other than those of the aforementioned stacked via structure) and the through hole 21.

Figure 6:
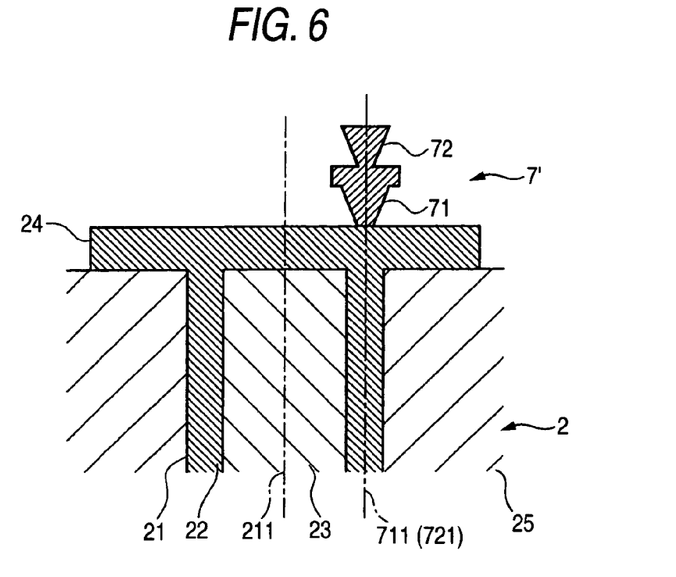
FIG. 6 is a schematic diagram illustrating another construction mode ① of the wiring resin substrate of the invention.
Figure 9:
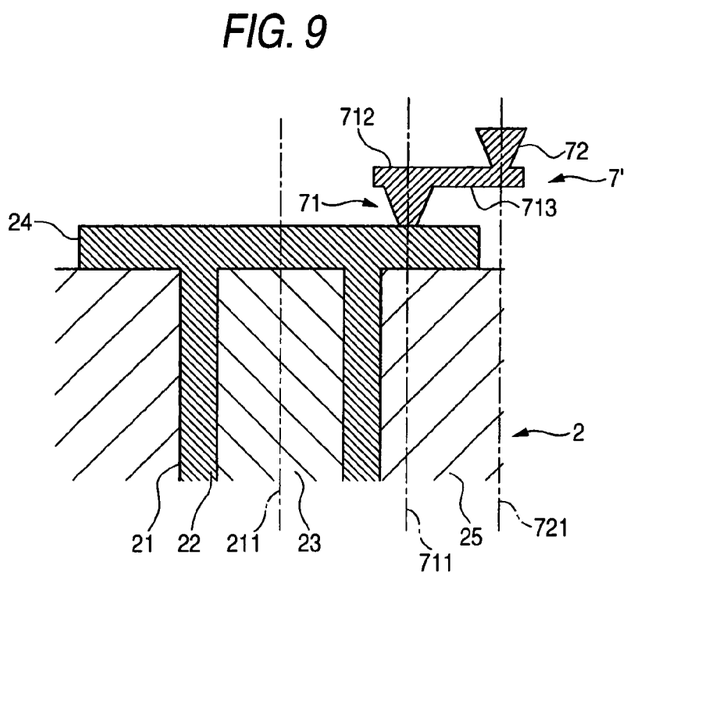
FIG. 9 is a schematic diagram illustrating another construction mode ④ of the wiring resin substrate of the invention.

In FIG. 6, the respective center axes 711 and 721 of the filled vias 71 and 72 are not aligned with the center axis 211 of the through hole 21. In FIG. 7, the center axis 721 of the upper side filled via 72 is more spaced from the center axis 211 of the through hole 21 than the center axis 711 of the lower side filled via 71. In FIG. 8, that upper side filled via 72 of the connection portion 7', which is to be connected to the ball pad conductor 4 (although not shown), is arranged at a position other than that above the through hole 21. In FIG. 9, the filled vias 71 and 72 composing the connection portion 7' are arranged not above the through hole 21. Here, in the structures in which the filled vias 71 and 72 are not connected substantially concentrically, the lower side filled via 71 is composed of the body portion 712 and the connection layer 713 extended toward and connected to the upper side filled via 72 (the center axis 711 is regulated by the body portion 712).

Here, the wiring resin substrate with balls of the invention is manufactured by the well-known build-up technique (e.g., the subtractive method, the additive method or the semi-additive method), as described in Patent Publication 3 (JP-A-2000-307220, Paragraphs [0014 and 0015]) or Patent Publication 4 (JP-A-2000-34051, Paragraphs [0014 and 0015]).

EXAMPLES

Here will be described a specific example of the wiring resin substrate with balls of the invention together with its comparison. The aforementioned construction mode of FIG. 1 was adopted as Example. In Comparison, the via conductor composed of the filled vias illustrated in FIGS. 3A to 3C, and the ball pad conductor were arranged to have their axes aligned with each other above the center axis of the through hole.

Figure 4:
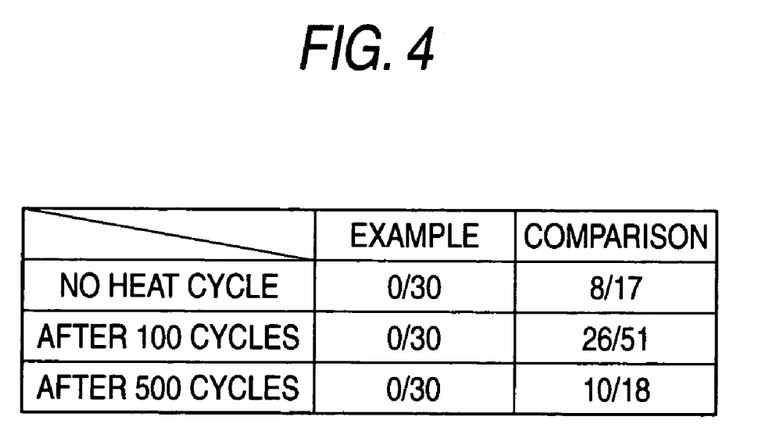
FIG. 4 is a table enumerating cracking percentages.

For Example and Comparison, there were individually prepared three kinds of samples: ① before; ② 100 cycles after; and ③ 500 cycles after a heat cycle (for ten minutes per cycle), in which a heating and a cooling were repeated in the temperature range of −55° C. to 125° C., and section SEM (Scanning Electron Microscope) observations were performed to evaluate the cracking percentages. These evaluation results are tabulated in FIG. 4. In FIG. 4, the denominators of the cracking percentages indicate the total number of samples, and the numerators indicate the number of cracked samples.

According to the evaluation results of FIG. 4, no fault such as the cracking was found in the SEM images of all the samples of Embodiment of ① before the heat cycle, ② after 100 cycles and ③ after 500 cycles. In Comparison, on the contrary, the cracking was found in one half of or more samples ② after 100 cycles and ③ after 500 cycles. Moreover, it was found that some of the samples of ① before the heat cycle had already been cracked. It seems that the cracking was caused by the heat treatment at the solder ball disposing time.

This application is based on Japanese Patent application JP 2003-54201, filed Feb. 28, 2003, Japanese Patent application JP 2003-54572, filed Feb. 28, 2003, and Japanese Patent application JP 2004-23494, filed Jan. 30, 2004, the entire contents of those are hereby incorporated by reference, the same as if set forth at length.

What is claimed is:

1. A wiring substrate comprising:
   a core substrate including an insulating substrate, a through hole provided through the insulating substrate, a substantially cylindrical through hole conductor formed on an inner circumference of said through hole, and a filling material filling a hollow portion of said through hole conductor;
   a cover-shaped conductor layer provided on at least one principal face of said core substrate and in a shape containing an end face of said through hole and having conduction to said through hole conductor;
   a plurality of resin layers provided over said cover-shaped conductor layer;
   a ball pad conductor provided over said resin layers and having a solder ball to be connected with a connection terminal of an external device; and
   a connection portion including via conductors buried individually in said resin layers for bringing said cover-shaped conductor layer and said ball pad conductor into conduction,
   wherein the connection portion comprises a conformal via connected to said cover-shaped conductor layer and one or more filled vias connecting said conformal via to said ball pad, said conformal via having a hole wall, a metallic material arranged along the hole wall, and a resin material filling the remaining portion of the hole, and
   taking a through direction of said through hole as being a center axis direction, an individual center axes of said via conductor composed of said one or more filled vias and said ball pad conductor are not aligned with the center axis of said through hole.

2. The wiring substrate according to claim 1, wherein said filling material filling a hollow portion of said through hole conductor comprises a resin.

3. The wiring substrate according to claim 1, wherein the one or more filled vias constituting the connection portion each has a center axis that is spaced by 50 μm or more and 300 μm or less from a center axis of the through hole.

4. The wiring substrate according to claim 1, wherein said conformal via is connected to an upper side principal face of the cover-shaped conductor layer.

* * * * *